(12) United States Patent
Raj et al.

(10) Patent No.: US 8,643,134 B2
(45) Date of Patent: Feb. 4, 2014

(54) GAN-BASED SCHOTTKY BARRIER DIODE WITH FIELD PLATE

(75) Inventors: Madhan Raj, Cupertino, CA (US); Richard J. Brown, Los Gatos, CA (US); Thomas R. Prunty, Santa Clara, CA (US); David P. Bour, Cupertino, CA (US); Isik C. Kizilyalli, San Francisco, CA (US); Hui Nie, Cupertino, CA (US); Andrew P. Edwards, San Jose, CA (US); Linda Romano, Sunnyvale, CA (US)

(73) Assignee: Avogy, Inc., San Jose, CA (US)

( * ) Notice: Subject to any disclaimer, the term of this patent is extended or adjusted under 35 U.S.C. 154(b) by 0 days.

(21) Appl. No.: 13/300,028

(22) Filed: Nov. 18, 2011

(65) Prior Publication Data

US 2013/0127006 A1 May 23, 2013

(51) Int. Cl.
*H01L 29/47* (2006.01)

(52) U.S. Cl.
USPC ............. 257/472; 257/73; 257/267; 257/280; 257/473

(58) Field of Classification Search
USPC .............................. 257/73, 267, 280, 472, 473
See application file for complete search history.

(56) References Cited

U.S. PATENT DOCUMENTS

| 5,105,242 | A  | * | 4/1992 | Fujihira et al. ................ 257/284 |
|---|---|---|---|---|
| 6,768,146 | B2 |   | 7/2004 | Yoshida |
| 6,949,774 | B2 |   | 9/2005 | Parikh et al. |
| 7,531,889 | B2 |   | 5/2009 | Kiyama et al. |
| 7,915,643 | B2 |   | 3/2011 | Suh et al. |
| 2010/0059761 | A1 | * | 3/2010 | Horii et al. ..................... 257/76 |
| 2011/0297954 | A1 |   | 12/2011 | Okamoto et al. |

* cited by examiner

*Primary Examiner* — Tan N Tran

(74) *Attorney, Agent, or Firm* — Kilpatrick Townsend & Stockton LLP

(57) ABSTRACT

A method for fabricating a III-nitride semiconductor device includes providing a III-nitride substrate having a first surface and a second surface opposing the first surface, forming a III-nitride epitaxial layer coupled to the first surface of the III-nitride substrate, and removing at least a portion of the III-nitride epitaxial layer to form a first exposed surface. The method further includes forming a dielectric layer coupled to the first exposed surface, removing at least a portion of the dielectric layer, and forming a metallic layer coupled to a remaining portion of the dielectric layer such that the remaining portion of the dielectric layer is disposed between the III-nitride epitaxial layer and the metallic layer.

7 Claims, 10 Drawing Sheets

GAN-BASED SCHOTTKY BARRIER DIODE WITH FIELD PLATE

CROSS-REFERENCES TO RELATED APPLICATIONS

The following regular U.S. patent applications (including this one) are being filed concurrently, and the entire disclosure of the other application is incorporated by reference into this application for all purposes:

application Ser. No. 13/300,009, filed Nov. 18, 2011, entitled "GAN-BASED SCHOTTKY BARRIER DIODE WITH ALGAN SURFACE LAYER"; and application Ser. No. 13/300,028, filed Nov. 18, 2011, entitled "GAN-BASED SCHOTTKY BARRIER DIODE WITH FIELD PLATE".

BACKGROUND OF THE INVENTION

Power electronics are widely used in a variety of applications. Power electronic devices are commonly used in circuits to modify the form of electrical energy, for example, from AC to DC, from one voltage level to another, or in some other way. Such devices can operate over a wide range of power levels, from milliwatts in mobile devices to hundreds of megawatts in a high voltage power transmission system. Despite the progress made in power electronics, there is a need in the art for improved electronics systems and methods of operating the same.

SUMMARY OF THE INVENTION

The present invention relates generally to electronic devices. More specifically, the present invention relates to techniques for providing a Schottky barrier diode using III-nitride semiconductor materials with a field plate structure to help provide for edge termination. Merely by way of example, the invention has been applied to methods and systems for manufacturing field plates for Schottky barrier diodes using a dielectric layer formed with spin coating techniques disposed between one or more gallium-nitride (GaN) based epitaxial layers and a metallic layer. The methods and techniques can be applied to a variety of compound semiconductor systems such as PIN diodes, vertical junction field-effect transistors (JFETs), thyristors, and other devices.

According to an embodiment of the present invention, a method for fabricating a GaN Schottky diode is provided. The method includes providing an n-type GaN substrate having a first surface and a second surface opposing the first surface, forming an n-type GaN epitaxial layer coupled to the first surface of the n-type GaN substrate, and removing at least a portion of the n-type GaN epitaxial layer to form a first exposed surface. The method further includes forming a dielectric layer coupled to the first exposed surface. The dielectric layer is formed using spin coating. The method also includes removing at least a portion of the dielectric layer, and forming a Schottky metal structure coupled to a portion of the n-type GaN epitaxial layer and a remaining portion of the dielectric layer such that the remaining portion of the dielectric layer is disposed between the n-type GaN epitaxial layer and the Schottky metal structure, and the Schottky metal structure forms a Schottky barrier with the portion of the n-type GaN epitaxial layer.

According to another embodiment of the present invention, a method for fabricating a III-nitride semiconductor device is provided. The method includes providing a III-nitride substrate having a first surface and a second surface opposing the first surface, forming a III-nitride epitaxial layer coupled to the first surface of the III-nitride substrate, and removing at least a portion of the III-nitride epitaxial layer to form a first exposed surface. The method further includes forming a dielectric layer coupled to the first exposed surface, removing at least a portion of the dielectric layer, and forming a metallic layer coupled to a remaining portion of the dielectric layer such that the remaining portion of the dielectric layer is disposed between the III-nitride epitaxial layer and the metallic layer.

According to yet another embodiment of the present invention, a III-nitride semiconductor device is provided. The III-nitride semiconductor device includes an active region for supporting current flow during operation of the III-nitride semiconductor device. The active region includes a III-nitride epitaxial material. A field plate region is physically adjacent to the active region. The field plate region includes the III-nitride epitaxial material, a spin-on dielectric material coupled to the III-nitride epitaxial material, and a metal coupled to the spin-on dielectric material.

Numerous benefits are achieved by way of the present invention over conventional techniques. For example, embodiments of the present invention enable the use of thicker dielectrics used in field plate formation in comparison with conventional techniques, which can result in devices capable of operating at higher voltages than conventional devices. Additionally, dielectrics used herein can have a relatively low dielectric constant, resulting in low capacitance, and may be tapered to enhance the effectiveness of the field plate.

Another advantage provided by embodiments of the present invention over conventional devices is based on the superior material properties of GaN-based materials. Embodiments of the present invention provide homoepitaxial GaN layers on bulk GaN substrates that are imbued with superior properties to other materials used for power electronic devices. High electron mobility, $\mu$, is associated with a given background doping level, N, which results in low resistivity, $\rho$, since $\rho=1/q\mu N$.

The ability to obtain regions that can support high voltage with low resistance compared to similar device structures in other materials allows embodiments of the present invention to provide resistance properties and voltage capability of conventional devices, while using significantly less area for the GaN device. Capacitance, C, scales with area, approximated as $C=\epsilon A/t$, so the smaller device will have less terminal-to-terminal capacitance. Lower capacitance leads to faster switching and less switching power loss.

These and other embodiments of the invention along with many of its advantages and features are described in more detail in conjunction with the text below and attached figures.

Figure 1A:
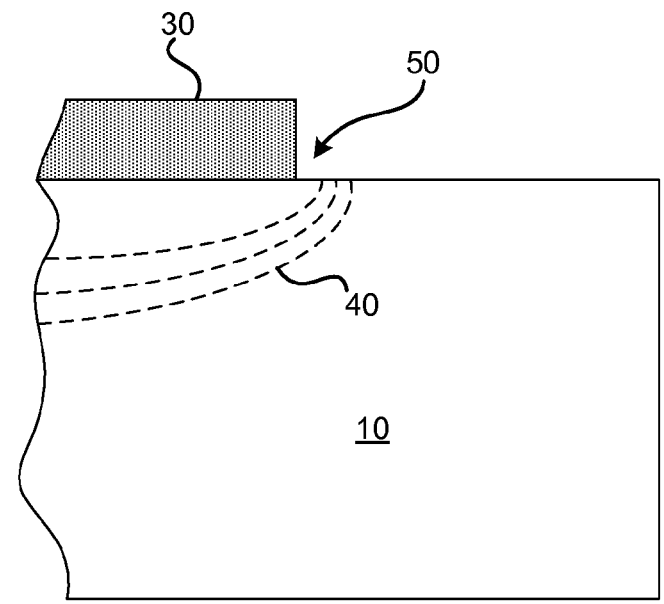
FIGS. 1A-1B are simplified cross-sectional diagrams of a portion of a Schottky diode with and without a field plate, respectively, according to certain embodiments of the present invention.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF SPECIFIC EMBODIMENTS

Embodiments of the present invention relate to electronic devices. More specifically, the present invention relates to forming a field plate to provide edge termination for Schottky diodes and other semiconductor devices. Merely by way of example, the invention has been applied to methods and systems for manufacturing field plates for Schottky barrier diodes using a dielectric layer formed with spin coating techniques disposed between one or more gallium-nitride (GaN) based epitaxial layers and a metallic layer. The methods and techniques can be applied to applied to a variety of compound semiconductor systems such as PIN diodes, vertical junction field-effect transistors (JFETs), thyristors, and other devices.

GaN-based electronic and optoelectronic devices are undergoing rapid development, and generally are expected to outperform competitors in silicon (Si) and silicon carbide (SiC). Desirable properties associated with GaN and related alloys and heterostructures include high bandgap energy for visible and ultraviolet light emission, favorable transport properties (e.g., high electron mobility and saturation velocity), a high breakdown field, and high thermal conductivity. In particular, electron mobility, $\mu$, is higher than competing materials for a given background doping level, N. This provides low resistivity, $\rho$, because resistivity is inversely proportional to electron mobility, as provided by equation (1):

$$\rho = \frac{1}{q\mu N}, \quad (1)$$

where q is the elementary charge.

Another superior property provided by GaN materials, including homoepitaxial GaN layers on bulk GaN substrates, is high critical electric field for avalanche breakdown. A high critical electric field allows a larger voltage to be supported over smaller length, L, than a material with a lower critical electric field. A smaller length for current to flow together with low resistivity give rise to a lower resistance, R, than other materials, since resistance can be determined by equation (2):

$$R = \frac{\rho L}{A}, \quad (2)$$

where A is the cross-sectional area of the channel or current path.

As described herein, Schottky diodes and other semiconductor devices are able to exploit the high critical electric field provided by GaN and related alloys and heterostructures utilizing edge termination techniques as provided by embodiments of the present invention. Edge termination techniques such as field plates and guard rings provide proper edge termination by alleviating high fields at the edge of the semiconductor device. When properly employed, edge termination allows a semiconductor device to break down uniformly at its main junction rather than uncontrollably at its edge.

According to embodiments of the present invention, field plates are formed to alleviate edge field crowding. The field plates utilize a spin-on dielectric (i.e., a dielectric formed using spin-on coating techniques) coupled to a gallium nitride (GaN) epitaxial layer or a pseudo-bulk GaN substrate. These spin-on dielectrics provide several advantages over the use of conventional dielectrics formed with plasma deposition methods. For example, it can take much longer to form conventional plasma-deposited dielectrics of a desired thickness, and plasma deposition can cause defects in an underlying GaN epitaxial layer. Furthermore, the thickness of plasma-deposited dielectrics is limited due to stress conditions, which rapidly increase with the thickness of the dielectric, thereby limiting the voltages at which devices utilizing the field plates can operate. Moreover, spin-on dielectrics can offer desirable characteristics, such as high break-down voltage, low dielectric constant (providing low capacitance), and the ability to form dielectric structures with tapered edges, which can enhance the edge-termination performance of field plates formed with spin-on dielectrics.

Figure 1B:
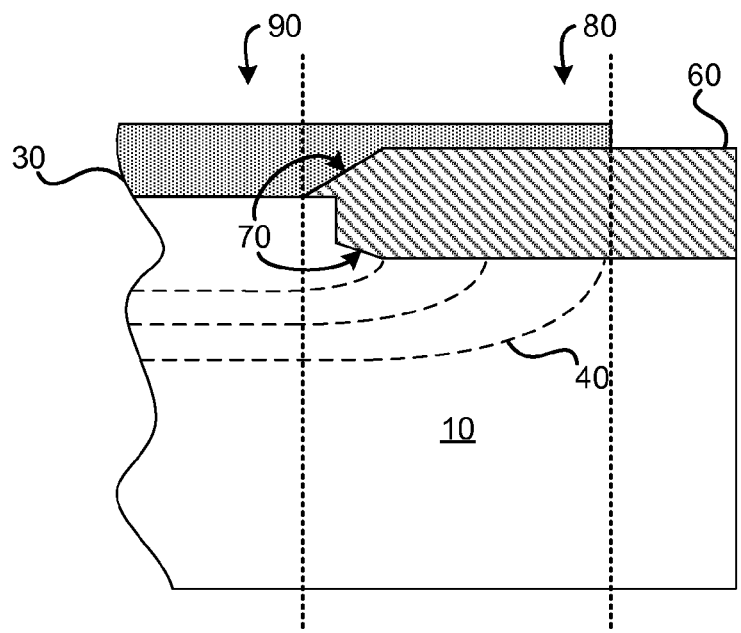

FIGS. 1A-1B are simplified cross-sectional diagrams of a portion of a Schottky diode according to an embodiment of the present invention, illustrating how the field plates provided herein can be used to improve the performance of the Schottky diode, as well as other semiconductor devices. FIG. 1A illustrates a Schottky diode in which a Schottky barrier is created between a Schottky metal 30 and a III-nitride semiconductor substrate 10, which can be an epitaxial layer. Because the Schottky diode of FIG. 1A has no termination structures, its performance is reduced. The electric field 40 (derived from the equipotential lines in FIG. 1A), is crowded near the edge 50 of the Schottky diode, causing breakdown at a voltage that can be much less than the parallel plane breakdown voltage for the Schottky diode. This phenomenon can be especially detrimental to the operation of high-voltage semiconductor devices.

FIG. 1B illustrates how a field plate can be used to alleviate field crowding near the edge of a Schottky diode. A field plate region 80 is provided physically adjacent to an active region 90. As an example, the metal of the field plate can be fabricated using the same Schottky metal 30 of the active region 90, extending laterally beyond the active region 90 of the Schottky diode. The field plate region 80 further includes a spin-on dielectric material 60 disposed between the Schottky metal 30 and the III-nitride semiconductor substrate 10. By extending the potential drop in this manner, the edge field plate region 80 helps enable the Schottky diode to operate at a breakdown voltage much closer to its parallel plane breakdown voltage. Furthermore, either or both of the spin-on dielectric material 60 and/or the III-nitride semiconductor substrate 10 can include angled surfaces 70 near the edge of the active region 90 of the Schottky diode. Such tapering can further enhance the effectiveness of the field plate, resulting in better control of the electric field 40 and better performance of the Schottky diode.

Methods for the formation of such field plates in structures formed from GaN and related alloys and heterostructures can differ from those used in other semiconductors, such as Si and SiC. In SiC, for example, oxides can be grown easily. Thus, rather than spin-on or plasma-deposited dielectrics, the dielectrics for field plates used in Si are typically grown. Furthermore, structures that would benefit from the incorporation of a field plate have rarely been manufactured using GaN and related alloys and heterostructures. For example, lasers can utilize structures formed from GaN-based materials, but because there is no reverse bias in such structures, there has been little need for the incorporation of a field plate. On the other hand, now that various structures, including high-voltage semiconductor devices, can be formed on GaN and related alloys and heterostructures, the field plates discussed herein can play a valuable role in ensuring the structures do not suffer from the adverse effects of edge crowding.

Figure 2:
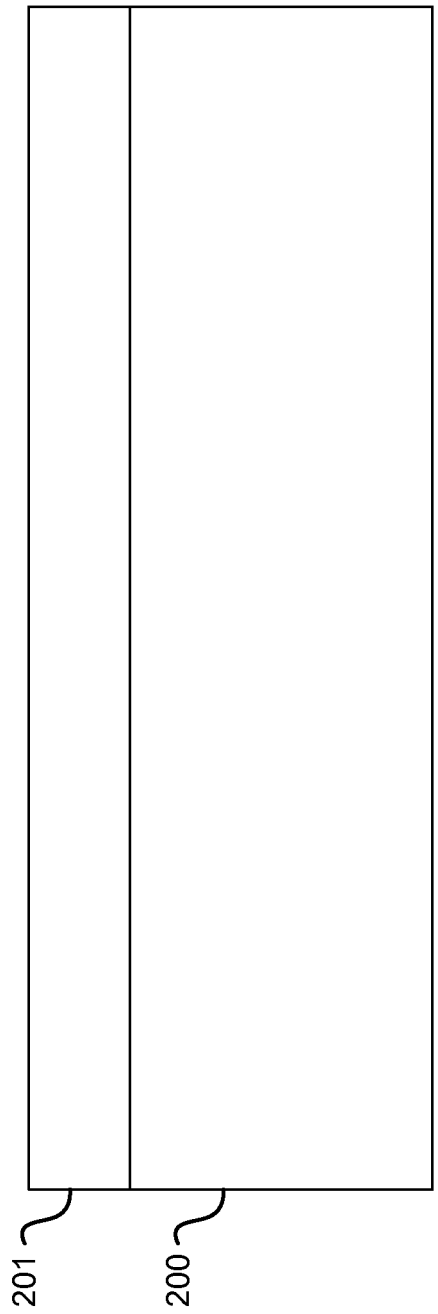
FIGS. 2-7 are simplified cross-sectional diagrams illustrating a process for creating a Schottky diode in GaN with a field plate according to an embodiment of the present invention.

FIGS. 2-7 are simplified cross-sectional diagrams illustrating a process for creating a Schottky diode in GaN with a field plate according to an embodiment of the present invention. The simplified cross-sectional diagrams of a Schottky diode illustrated in FIGS. 2-7 show a process for creating the Schottky diode in GaN with a field plate according to one embodiment. Similar techniques may be applied to form field plates for semiconductor devices other than a Schottky diode. Referring to FIG. 2, a GaN epitaxial layer 201 is formed on a GaN substrate 200 having the same conductivity type. The GaN substrate 200 can be a pseudo-bulk or bulk GaN material on which the GaN epitaxial layer 201 is grown. Dopant concentrations (e.g., doping density) of the GaN substrate 200 can vary, depending on desired functionality. For example, a GaN substrate 200 can have an n+ conductivity type, with dopant concentrations ranging from $1\times10^{17}$ cm$^{-3}$ to $1\times10^{19}$ cm$^{-3}$. Although the GaN substrate 200 is illustrated as including a single material composition, multiple layers can be provided as part of the substrate. Moreover, adhesion, buffer, and other layers (not illustrated) can be utilized during the epitaxial growth process. One of ordinary skill in the art would recognize many variations, modifications, and alternatives.

The properties of the GaN epitaxial layer 201 can also vary, depending on desired functionality. The GaN epitaxial layer 201 can serve as a drift region for the Schottky diode, and therefore can be a relatively low-doped material. For example, the GaN epitaxial layer 201 can have an n− conductivity type, with dopant concentrations ranging from $1\times10^{14}$ cm$^{-3}$ to $1\times10^{18}$ cm$^{-3}$. Furthermore, the dopant concentration can be uniform, or can vary, for example, as a function of the thickness of the drift region.

The thickness of the GaN epitaxial layer 201 can also vary substantially, depending on the desired functionality. As discussed above, homoepitaxial growth can enable the GaN epitaxial layer 201 to be grown far thicker than layers formed using conventional methods. In general, in some embodiments, thicknesses can vary between 0.5 µm and 100 µm, for example. In other embodiments thicknesses are greater than 5 µm. Resulting parallel plane breakdown voltages for the Schottky diode 100 can vary depending on the embodiment. Some embodiments provide for breakdown voltages of at least 100V, 300V, 600V, 1.2 kV, 1.7 kV, 3.3 kV, 5.5 kV, 13 kV, or 20 kV.

Different dopants can be used to create n- and p-type GaN epitaxial layers and structures disclosed herein. For example, n-type dopants can include silicon, oxygen, selenium, tellurium, sulfur, or the like. P-type dopants can include magnesium, beryllium, calcium zinc, or the like.

Figure 3:
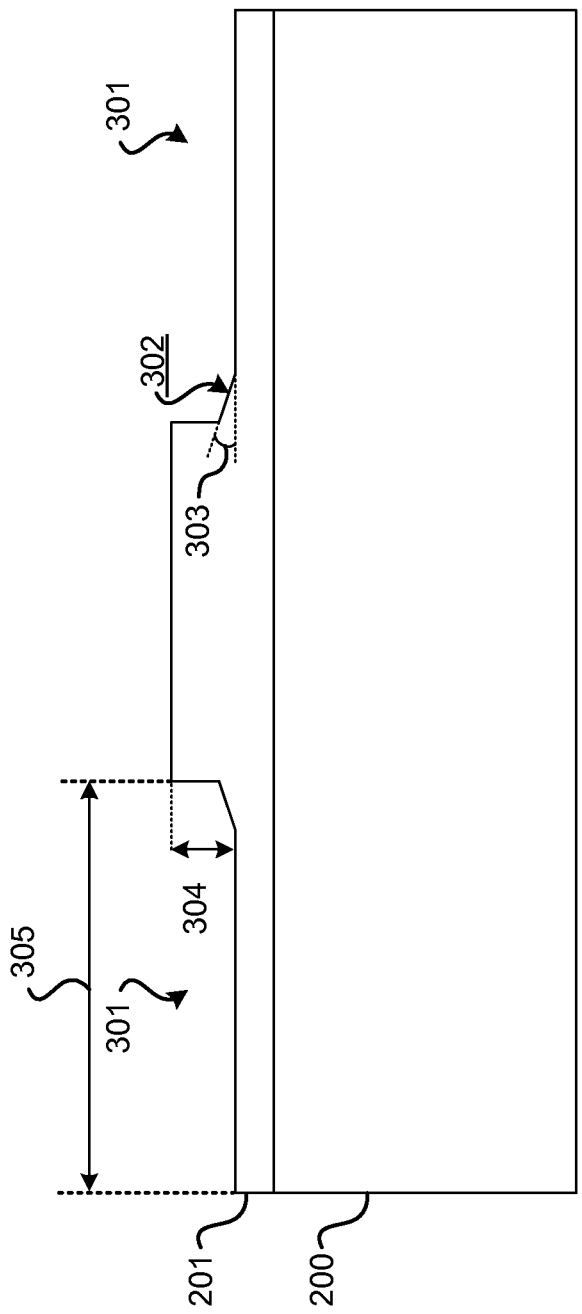

FIG. 3 illustrates the removal at least a portion of the GaN epitaxial layer 201, exposing one or more surfaces 301 on which a dielectric subsequently can be formed. The depth 304 and width 305 of the removed portions can vary depending on desired functionality of the Schottky diode. In some embodiments, the depth 304 of the removal can range from approximately 0.1-10 µm, and the width 305 of the removal can range from approximately 3-100 µm. The removal can be performed by etching the GaN epitaxial layer 201 or by using some other suitable removal process. For example, a controlled etch using an etch mask (not shown but having the width 305 of the removed portions) can be used, designed to stop at approximately the depth 304 of the removed portions. Inductively-coupled plasma (ICP) etching and/or other common GaN etching processes can be used.

As illustrated in FIG. 3, the removal of the portions of the GaN epitaxial layer 201 also can include forming angled surfaces 302. Known processing recipes can be utilized to form the angled surface 302, which is disposed at an angle 303 with respect to the exposed surface 301. The angle can be any of a variety of angles, depending on desired functionality of the resulting Schottky diode. In some embodiments, the angle 303 between the exposed surface 301 and the angled surface 302 is between 45° and 90°. In other embodiments, the angled surface 302 may be curved or include multiple angled surfaces.

Figure 4:
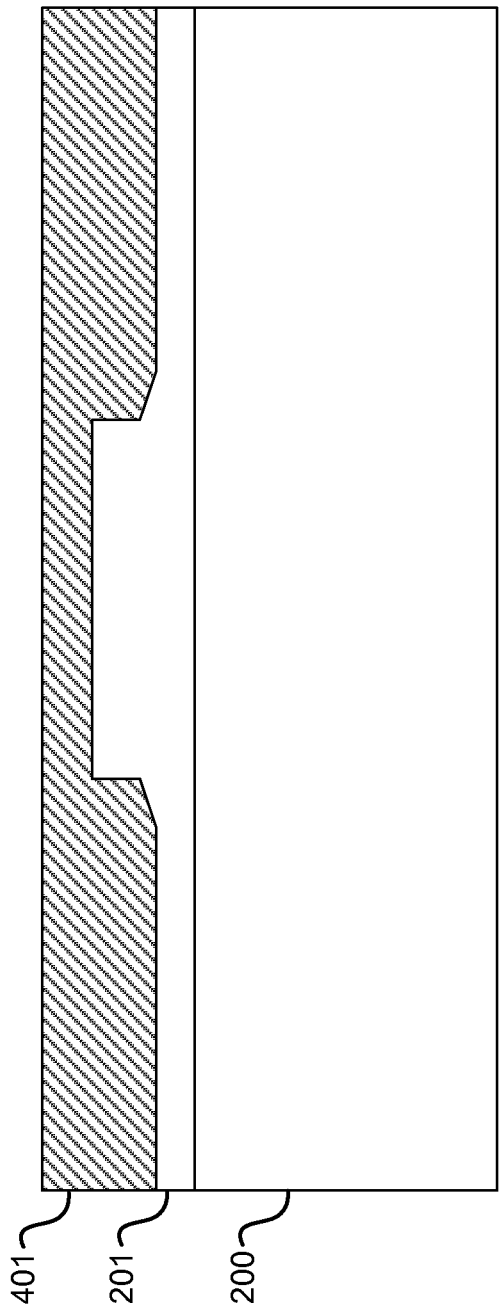

FIG. 4 illustrates the formation of a dielectric layer 401 coupled to the GaN epitaxial layer 201. As indicated previously, the dielectric layer 401 can comprise a spin-on dielectric formed using spin coating techniques. Such spin-on dielectrics can include, for example, benzocyclobutene (BCB), spin-on glass (SOG), low-k dielectrics, polyimides, etc., combinations thereof, or the like. These spin-on dielectrics can provide desirable characteristics (such as low dielectric constant) and can be manipulated to form sloped edges, as discussed below, to further enhance the effectiveness of the resulting field plate. Moreover, because they do not use plasma deposition, the quality of the surface of the GaN epitaxial layer 201 is preserved, which helps ensure proper functionality of the resulting Schottky diode. Embodiments also contemplate the use of other types of dielectrics that do not utilize plasma deposition and/or require additional high-temperature processes that could compromise the quality of the GaN epitaxial layer 201.

Figure 5A:
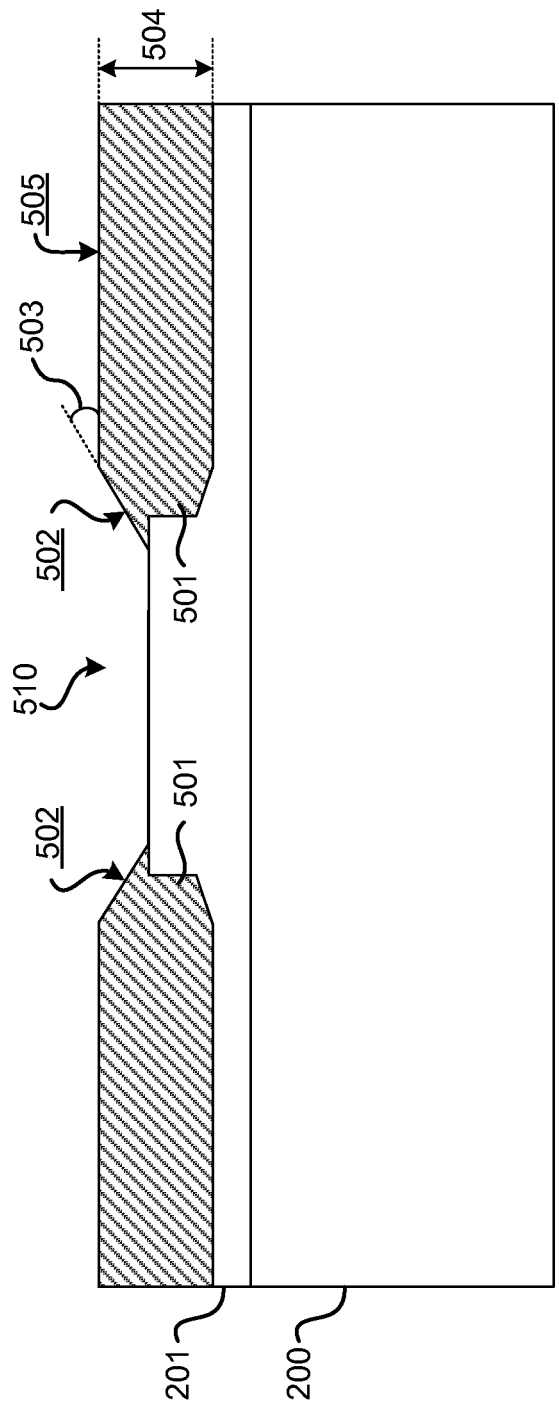

FIG. 5A illustrates the removal of a portion of the dielectric layer 401 to form an opening 510 that exposes the portion of the GaN epitaxial layer 201 that will become the active region of the Schottky diode. The removal can be performed by a controlled etch designed to stop at approximately the interface between the dielectric layer 401 and the GaN epitaxial layer 201. In the illustrated embodiment, the material removal process used to remove the dielectric layer 401 terminates at the interface of dielectric layer 401 and GaN epitaxial layer 201, however, in other embodiments, the process terminates at a different depth, for example, extending a predetermined distance into GaN epitaxial layer 201.

As illustrated in FIG. 5A, remaining portions 501 of the dielectric layer 401 can include one or more angled surfaces 502 to help enhance the effectiveness of the resulting field plate. Depending on the type of dielectric, different types of etching and/or other removal can be performed to form these angled surfaces 502. For example, in the case of SOG, the SOG can be cured and then etched using plasma and/or wet etching recipes that can provide the desired slope of the angled surfaces 502. BCB, on the other hand, is a photo-definable layer that can be exposed in a manner similar to photoresist, then cured. Recipes can be utilized that adjust exposure and developing time to allow for angled surfaces 502 to be formed upon the removal of portions of the dielectric layer 401.

Figure 5B:
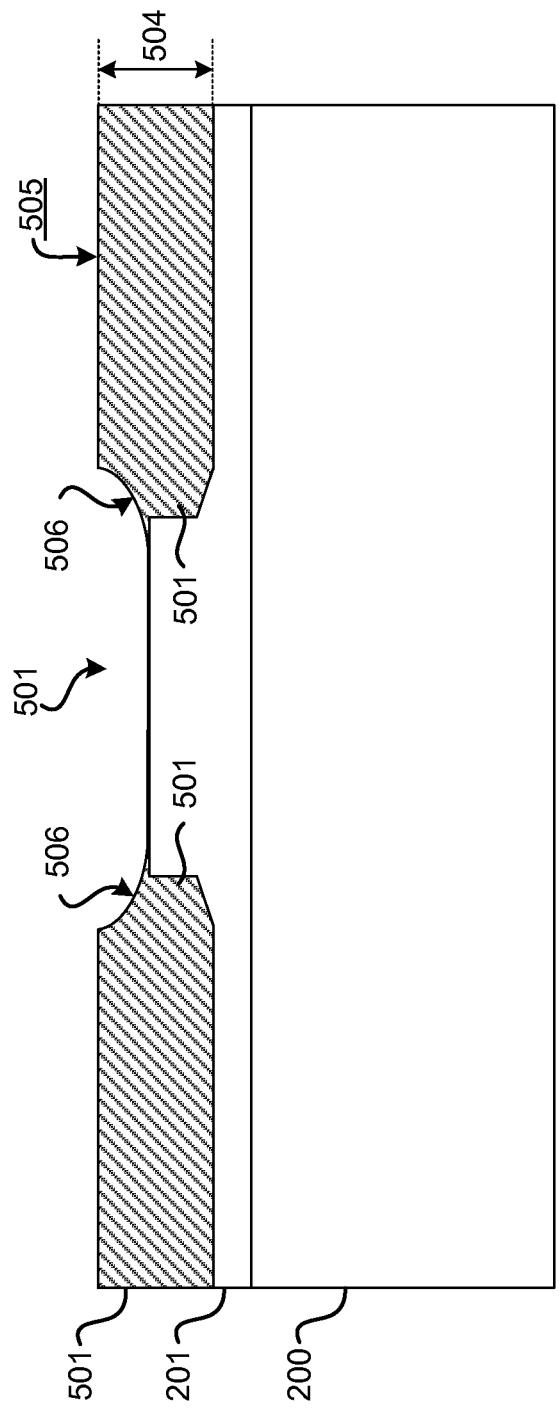

Depending on the desired functionality, the slope of angled surfaces 502 of the dielectric can vary. For example, as illustrated in FIG. 5A, an angled surface 502 can be an approximately planar surface that forms an angle 503 in reference to a top surface 505 of a remaining portion 501 of the dielectric layer 401 (i.e., the surface approximately opposite the surface coupled to the previously exposed surface 301 of the GaN epitaxial layer 201). Generally speaking, the effectiveness of the edge termination provided by the resulting field plate increases as this angle 503 decreases. With this in mind, some embodiments include an angled surfaces 502 in which the corresponding angle 503 from the top surface 505 is less than 45°. For example, embodiments can include an angle 503 of 20°, 10°, or less. In yet other embodiments, as illustrated in FIG. 5B, the angled surface 506 can have a varying slope with respect to the top surface 505.

A thickness 504 of the remaining portions 501 of the dielectric layer also can vary, depending on desired functionality. Although thicknesses can vary, depending on the physical and electrical characteristics of the dielectric material, the thickness 504 generally increases with increased operating voltage. Table 1 illustrates dielectric thicknesses for predetermined operating voltages. As shown in Table 1, the approximate thickness 504 of a dielectric layer of SOG is listed along with corresponding operating voltages. The approximate thickness of the dielectric layer can vary, depending on the desired operating voltages.

TABLE 1

Dielectric Thicknesses for Certain Operating Voltages

| Operating Voltage (V) | Dielectric Thickness (µm) |
|---|---|
| 600 | 0.3 |
| 1200 | 0.5-0.7 |
| 2000 | 1.0 |

Table 1 lists a few example thicknesses for illustrative purposes only. Depending the composition of remaining portions 501 of the dielectric layer 401 and/or the desired operating voltages, embodiments can include thicknesses 504 other than those shown in Table 1. One of ordinary skill in the art would recognize many variations, modifications, and alternatives.

Figure 6:
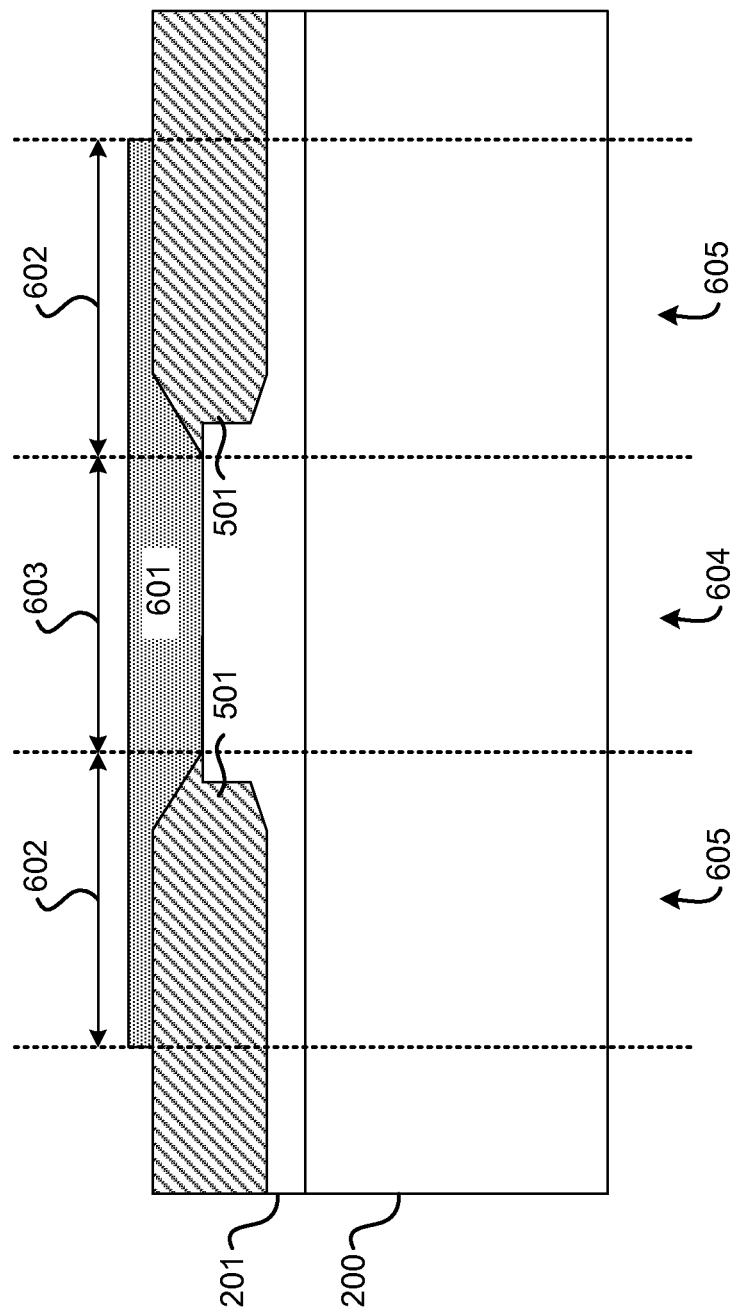

FIG. 6 illustrates the formation of a Schottky metal structure 601 coupled to the GaN epitaxial layer 201 and extending laterally over portions of the remaining portions 501 of the dielectric layer. The Schottky metal structure 601 can be one or more layers of metal and/or alloys to create a Schottky barrier with the GaN epitaxial layer 201. The Schottky metal structure 601 further can be formed using a variety of techniques, including lift-off and/or deposition with subsequent etching, which can vary depending on the metals used. In some embodiments, the Schottky metal structure 601 can include nickel, platinum, palladium, silver, gold, and the like.

The formation of the Schottky metal structure 601 as shown in FIG. 6 results in the formation of different regions of the Schottky barrier diode. An active region 604 includes the portion of the Schottky barrier diode (or, in other embodiments, other semiconductor device) supporting current flow. That is, the active region 604 includes the portion of the Schottky metal structure 601 coupled to the GaN epitaxial layer 201. Field plate regions 605, on the other hand, include the regions of the Schottky barrier diode in which at least some of the remaining portions 501 of the dielectric layer are disposed between the Schottky metal layer 602 and the GaN epitaxial layer 201. As discussed above, these field plate regions 605 serve to alleviate edge crowding of the Schottky barrier diode, enabling the Schottky barrier diode to operate at a voltage much closer to the Schottky barrier diode's parallel plane breakdown voltage. The respective widths 603 and 602 of the active and field plate regions, 604 and 605, respectively, can vary depending on the desired functionality of the Schottky barrier diode. In some embodiments, for example, the width 603 of the active region depends on the designed current rating of the Schottky diode and can range from 1 µm at the edge of a finger design to several millimeters in large area devices, and the width 602 of the field plate regions 605 can range from 2 µm to 100 µm, for example. One of ordinary skill in the art would recognize many variations, modifications, and alternatives.

Figure 7:
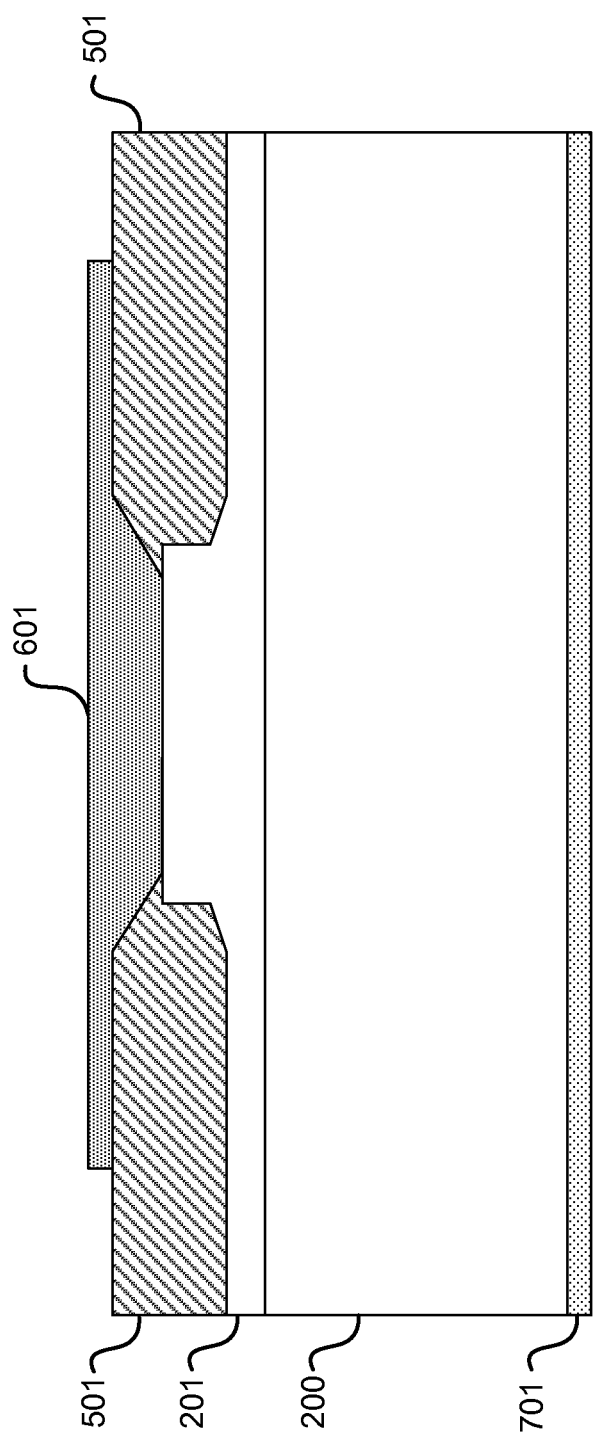

FIG. 7 illustrates the formation of a metallic contact layer 701 to a lower surface of the GaN substrate 200. The metallic contact layer 701 can be one or more layers of metal that serve as an ohmic contact for the cathode of the Schottky diode. For example, the metallic contact layer 701 can comprise a titanium-aluminum (Ti/A1) ohmic metal. Other metals and/or alloys can be used including, but not limited to, aluminum, nickel, gold, combinations thereof, or the like. In some embodiments, an outermost metal of the metallic contact layer 701 can include gold, tantalum, tungsten, palladium, silver, or aluminum, combinations thereof, and the like. The metallic contact layer 701 can be formed using any of a variety of methods such as sputtering, evaporation, or the like.

Although some embodiments are discussed in terms of GaN substrates and GaN epitaxial layers, the present invention is not limited to these particular binary III-V materials and is applicable to a broader class of III-V materials, in particular III-nitride materials. Additionally, although a GaN substrate is illustrated in FIG. 2, embodiments of the present invention are not limited to GaN substrates. Other III-V materials, in particular, III-nitride materials, are included within the scope of the present invention and can be substituted not only for the illustrated GaN substrate, but also for other GaN-based layers and structures described herein. As examples, binary III-V (e.g., III-nitride) materials, ternary III-V (e.g., III-nitride) materials such as InGaN and AlGaN, quaternary III-nitride materials, such as AlInGaN, doped versions of these materials, and the like are included within the scope of the present invention.

Some embodiments provided in relation to the fabrication process illustrated in FIGS. 2-7 were discussed in terms of having an n-type drift layer grown on an n-type substrate. However, the present invention is not limited to this particular configuration. In other embodiments, substrates with p-type doping are utilized. Additionally, embodiments can use materials having an opposite conductivity type to provide devices with different functionality. Thus, although some examples relate to the growth of n-type GaN epitaxial layer(s) doped with silicon, in other embodiments the techniques described herein are applicable to the growth of highly or lightly doped material, p-type material, material doped with dopants in addition to or other than silicon such as Mg, Ca, Be, Ge, Se, S, O, Te, and the like. The substrates discussed herein can include a single material system or multiple material systems including composite structures of multiple layers. One of ordinary skill in the art would recognize many variations, modifications, and alternatives.

Additionally, although described in relation to the fabrication of a Schottky barrier diode, the techniques provided herein for the formation of field plates can be applied to a variety of structures including, but not limited to, PIN diodes, vertical junction field-effect transistors (JFETs), thyristors, and other semiconductor devices.

Figure 8:
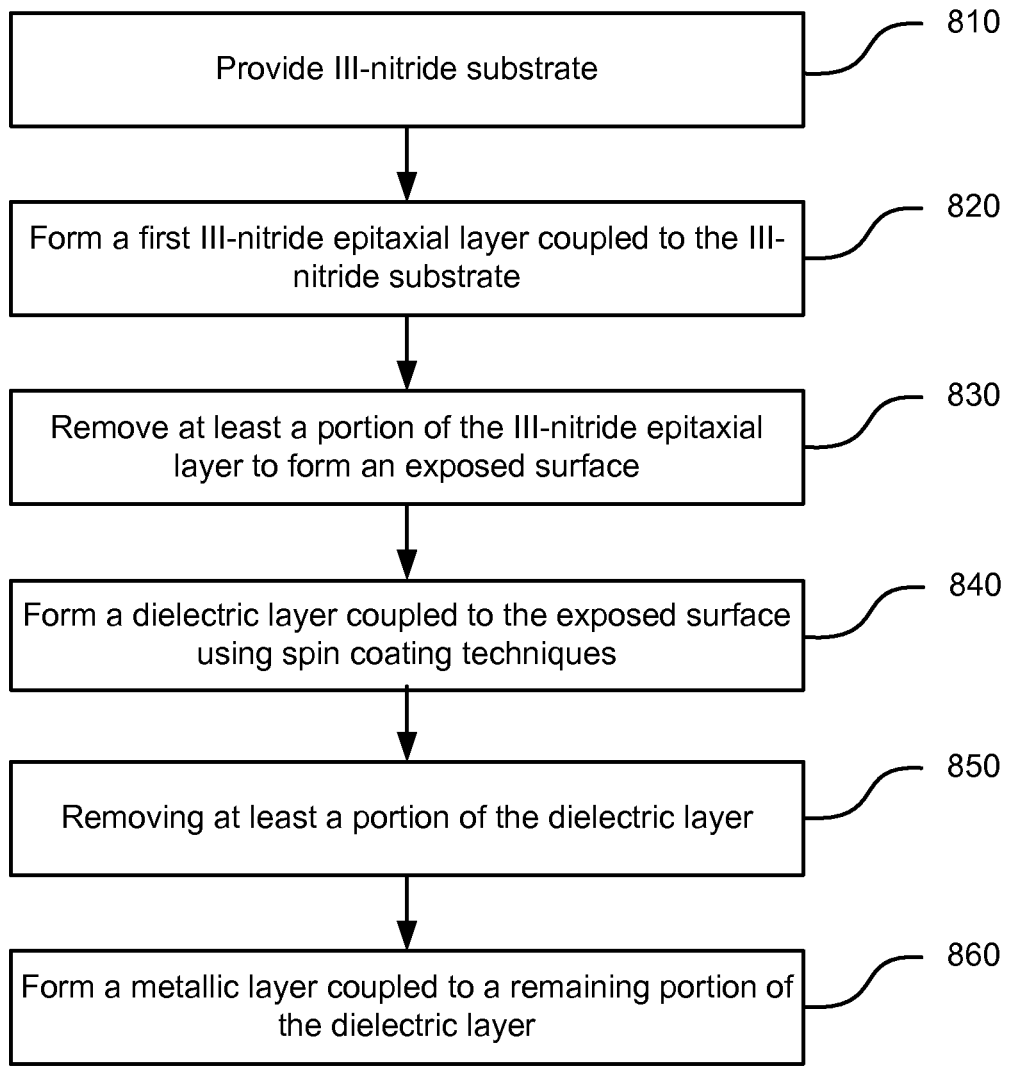
FIG. 8 is a simplified flowchart illustrating a method of fabricating a III-nitride semiconductor device with a field plate according to another embodiment of the present invention.

FIG. 8 is a simplified flowchart illustrating a method of fabricating a III-nitride semiconductor device having field plates, according to an embodiment of the present invention. Referring to FIG. 8, a III-nitride substrate is provided (810).

In an embodiment, the III-nitride is a GaN substrate with n+ conductivity type. The method also includes forming a III-nitride epitaxial layer (e.g., an n-type GaN epitaxial layer) coupled to the III-nitride substrate (820). In some embodiments, such as those in which a Schottky barrier diode is the semiconductor device formed, the III-nitride substrate and first III-nitride epitaxial layer are characterized by a first conductivity type, for example n-type conductivity. Using homoepitaxy techniques, the thickness of the III-nitride epitaxial layer can be thicker than available using conventional techniques, for example, between about 1 μm and about 100 μm.

The method further includes removing at least a portion of the III-nitride epitaxial layer to form an first exposed surface (830). As indicated previously, the removal process can include a variety of processes, such as etching. The physical dimension of the portions removed by the removal process can vary, depending on a variety of factors (e.g., composition and thickness of the subsequently-formed dielectric material, operation voltage, etc.), as will be appreciated by one of ordinary skill in the art.

The method further includes forming a dielectric layer coupled to the exposed surface of the III-nitride epitaxial layer using spin-coating techniques (840). The thickness and/or composition of the dielectric layer can vary, depending on desired functionality of the resulting III-nitride semiconductor device. As indicated hereinabove, spin-on dielectrics (i.e., dielectrics formed using spin-coating techniques) can preserve the structural integrity of the III-nitride epitaxial layer and are not limited by stress considerations in the same way plasma deposited dielectrics are limited. Even so, in alternative embodiments, other non-plasma, low-temperature techniques of dielectric deposition and/or formation can be used.

At least a portion of the dielectric layer is removed (850). For embodiments in which the III-nitride semiconductor device comprises a Schottky diode, the removal can include exposing a portion of the III-nitride epitaxial layer. This allows a Schottky metal to be formed on the III-nitride epitaxial layer to form the Schottky barrier. Embodiments in which the III-nitride semiconductor device comprises another device may involve removal of portion(s) of the dielectric layer to expose any of a variety of other components of the semiconductor device to allow electrical contact with the exposed components.

A metallic layer is then coupled to a remaining portion of the dielectric layer (860) such that the remaining portion of the dielectric layer is disposed between the III-nitride epitaxial layer and the metallic layer, forming a field plate region. As indicated in embodiments provided herein, the field plate region can be physically adjacent to an active region of the III-nitride semiconductor device to provide edge termination for the active region. For embodiments in which the III-nitride semiconductor device comprises a Schottky diode, for example, the metallic layer can comprise a Schottky metal structure in which the Schottky metal structure is also coupled to a portion of the III-nitride epitaxial layer for form a Schottky barrier with the III-nitride epitaxial layer an active region.

It should be appreciated that the specific steps illustrated in FIG. 8 provide a particular method of fabricating a III-nitride semiconductor device with a field plate according to an embodiment of the present invention. Other sequences of steps may also be performed according to alternative embodiments. For example, alternative embodiments of the present invention may perform the steps outlined above in a different order. Moreover, the individual steps illustrated in FIG. 8 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 9:
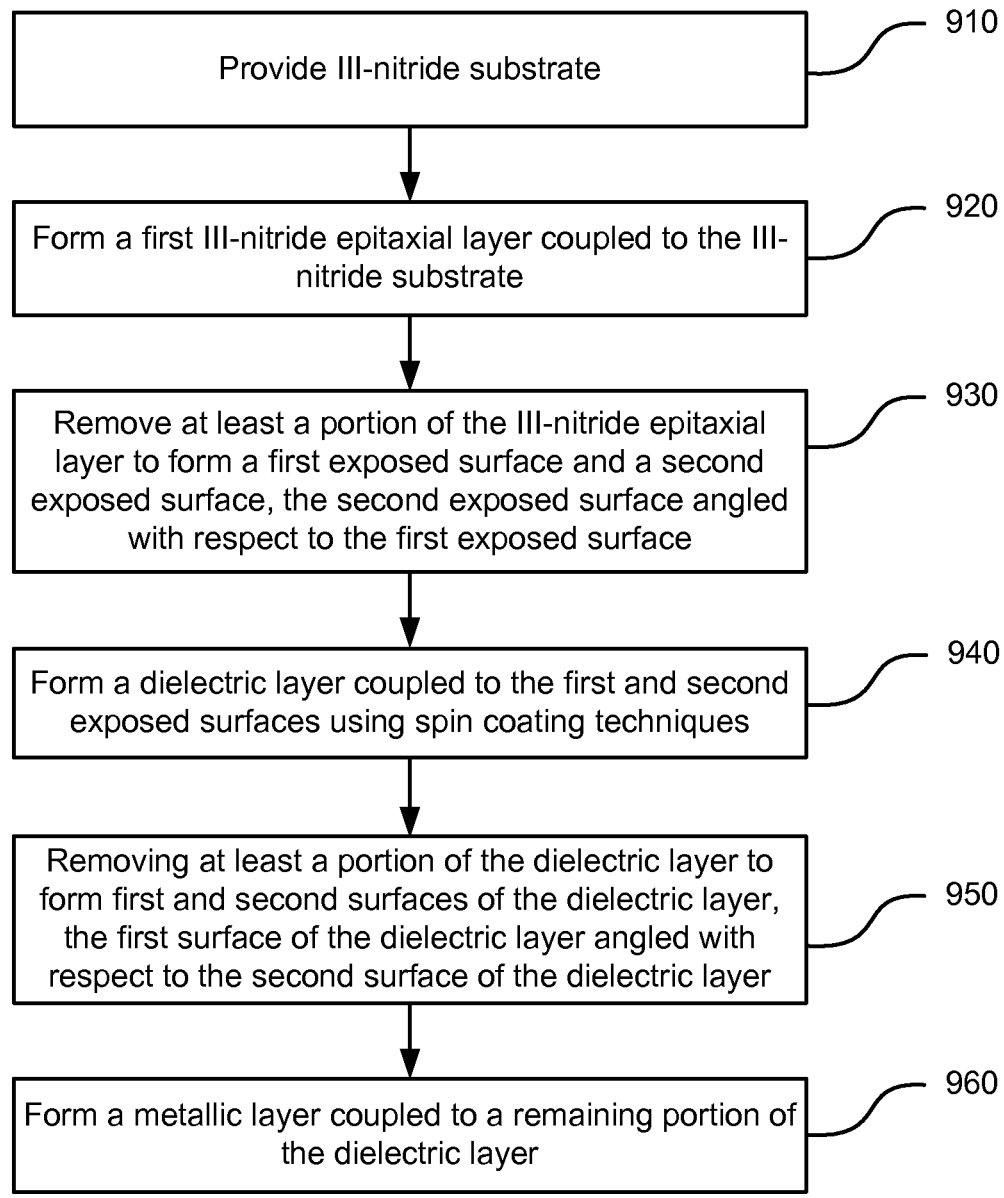
FIG. 9 is a simplified flowchart illustrating a method of fabricating a III-nitride semiconductor device with a field plate according to an alternative embodiment of the present invention.

FIG. 9 is a simplified flowchart illustrating method of fabricating a III-nitride semiconductor device having field plates according to another embodiment of the present invention. As shown by blocks 910-960, the method of FIG. 9 is similar to the method of FIG. 8 in some aspects. The method of FIG. 9, however, provides for tapering remaining portions of the epitaxial layer so that the epitaxial layer is thinner as the distance to the active region decreases. For example, removal of at least a portion of the III-nitride epitaxial layer forms a first and second exposed surface, the second exposed surface angled with respect to the first exposed surface (930). Furthermore, removal of at least a portion of the dielectric includes forming first and second surfaces of the dielectric layer, the first surface of the dielectric layer angled with respect to the second surface of the dielectric layer (950). As discussed previously, such tapering of the dielectric layer near the active region of the III-nitride semiconductor device can provide for enhanced edge termination.

It should be appreciated that the specific steps illustrated in FIG. 9 provide a particular method of fabricating a III-nitride semiconductor device with a field plate according to an embodiment of the present invention. Other sequences of steps may also be performed according to alternative embodiments. For example, alternative embodiments of the present invention may perform the steps outlined above in a different order. Moreover, the individual steps illustrated in FIG. 9 may include multiple sub-steps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A III-nitride semiconductor device comprising:
   an active region for supporting current flow during operation of the III-nitride semiconductor device, the active region comprising a III-nitride epitaxial material; and
   a field plate region physically adjacent to the active region, the field plate region including:
   the III-nitride epitaxial material;
   a spin-on dielectric material in physical contact with a first surface and a second surface of the III-nitride epitaxial material, wherein the second surface is angled with respect to the first surface; and
   a metal coupled to the spin-on dielectric material.

2. The III-nitride semiconductor device of claim 1 wherein an angle between the first surface and the second surface is between 45° and 90°.

3. The III-nitride semiconductor device of claim 1 wherein a first surface of the spin-on dielectric material is angled with respect to a second surface of the spin-on dielectric material.

4. The III-nitride semiconductor device of claim 3 wherein an angle between the first surface of the spin-on dielectric material and the second surface of the spin-on dielectric material is less than 45°.

5. The III-nitride semiconductor device of claim 3 wherein the first surface has a varying slope with respect to the second surface.

6. The III-nitride semiconductor device of claim 1 wherein the metal comprises a Schottky metal structure coupled with a portion of the III-nitride epitaxial material, the Schottky metal structure forming a Schottky barrier with the portion of the III-nitride epitaxial material.

7. The III-nitride semiconductor device of claim 1 wherein the spin-on dielectric material includes at least one of benzocyclobutene (BCB) or spin-on glass (SOG).

* * * * *